United States Patent
Takiar et al.

(10) Patent No.: US 7,485,501 B2
(45) Date of Patent: Feb. 3, 2009

(54) METHOD OF MANUFACTURING FLASH MEMORY CARDS

(75) Inventors: Hem Takiar, Fremont, CA (US); Shrikar Bhagath, San Jose, CA (US); Chin-Tien Chiu, Taichung (TW)

(73) Assignee: SanDisk Corporation, Milpitas, CA (US)

( * ) Notice: Subject to any disclaimer, the term of this patent is extended or adjusted under 35 U.S.C. 154(b) by 461 days.

(21) Appl. No.: 11/265,337

(22) Filed: Nov. 2, 2005

(65) Prior Publication Data

US 2007/0099340 A1    May 3, 2007

(51) Int. Cl.
*H01L 21/44* (2006.01)
(52) U.S. Cl. .................. 438/127; 438/113; 438/124; 438/462
(58) Field of Classification Search .................. 438/111, 438/112, 124, 125, 126, 127, 113, 114, 460, 438/462; 257/787, 788, 683, 701, 730
See application file for complete search history.

(56) References Cited

U.S. PATENT DOCUMENTS

| | | | |
|---|---|---|---|
| 5,729,894 A | 3/1998 | Rostoker et al. |
| D442,598 S | 5/2001 | Wallace et al. |
| D445,096 S | 7/2001 | Wallace |
| D447,481 S | 9/2001 | Wallace et al. |
| D452,243 S | 12/2001 | Wallace |
| D452,244 S | 12/2001 | Wallace et al. |
| D452,245 S | 12/2001 | Wallace et al. |
| D452,246 S | 12/2001 | Wallace et al. |
| D452,690 S | 1/2002 | Wallace et al. |
| D452,864 S | 1/2002 | Wallace et al. |
| D452,865 S | 1/2002 | Wallace et al. |
| D453,934 S | 2/2002 | Wallace et al. |
| D492,688 S | 7/2004 | Wallace et al. |
| 6,858,470 B1 | 2/2005 | Han et al. |
| 2002/0109242 A1 | 8/2002 | Kasuga et al. |
| 2004/0090829 A1 | 5/2004 | Miura et al. |
| 2004/0259291 A1 | 12/2004 | Takiar |

OTHER PUBLICATIONS

International Search Report dated May 22, 2007 in PCT Application No. PCT/US2006/042665.

*Primary Examiner*—Kevin M Picardat
(74) *Attorney, Agent, or Firm*—Vierra Magen Marcus & DeNiro LLP

(57) ABSTRACT

A method is disclosed for forming semiconductor packages by a process of punching and cutting the packages from a panel of integrated circuits. During an encapsulation process for encapsulating the packages in a molding compound, portions of the panel may be left free of molding compound. Portions of the panel left free of molding compound may subsequently be punched from the panel. These punched areas may define chamfers, notches or a variety of other curvilinear, rectilinear or irregular shapes in the outer edges of the finished semiconductor package. After the panel is punched, the integrated circuits may be singulated. By punching areas from the panel, and then cutting along straight edges, a simple, effective and cost efficient method is disclosed for obtaining finished semiconductor packages of a variety of desired shapes.

23 Claims, 6 Drawing Sheets

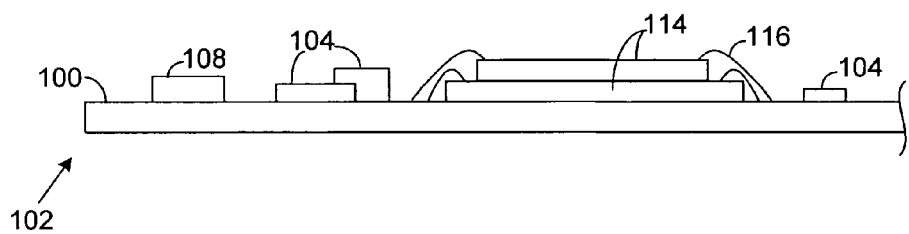
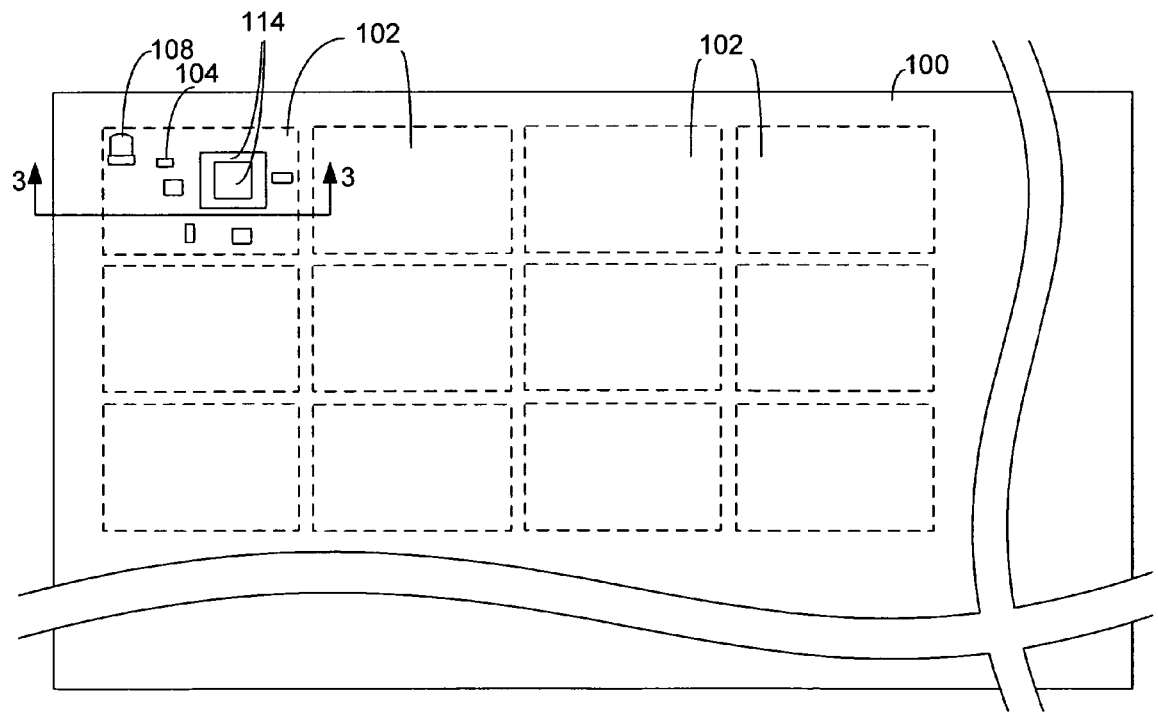

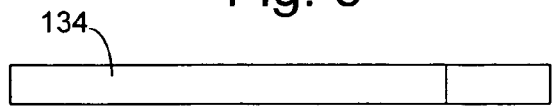
Fig. 8
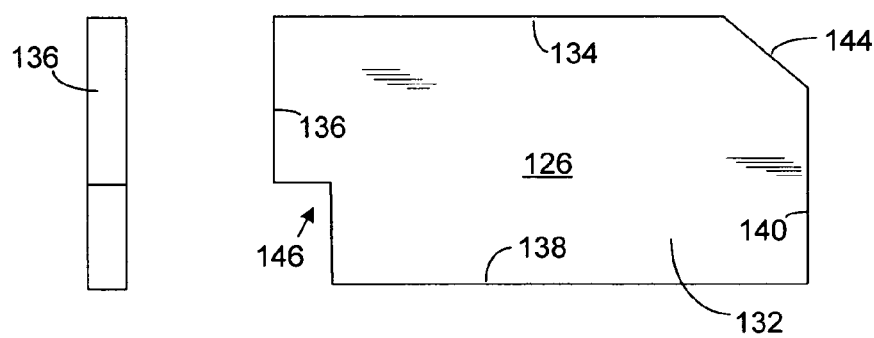
Fig. 7
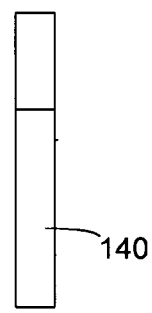
Fig. 11
Fig. 9
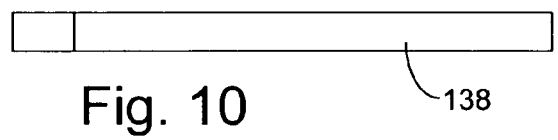
Fig. 10
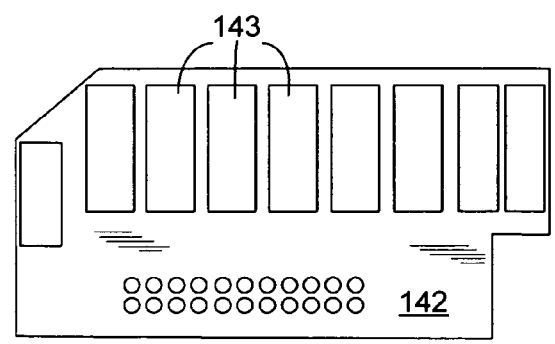
Fig. 12

METHOD OF MANUFACTURING FLASH MEMORY CARDS

BACKGROUND OF THE INVENTION

1. Field of the Invention

Embodiments of the present invention relate to methods of fabricating flash memory cards.

2. Description of the Related Art

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices.

One exemplary standard for flash memory cards is the so-called SD flash memory card. The SD (Secure Digital) Card is a secure flash memory about the size of a postage stamp. Jointly developed by SanDisk, Toshiba and Matsushita Electronic, the SD Card weighs approximately two grams and is used for memory storage in a wide variety of digital products, including for example digital music players, cellular phones, handheld PCs, digital cameras, digital video camcorders, smart phones, car navigation systems and electronic books.

In the past, electronic devices such as SD cards have included an integrated circuit system consisting of several individually packaged integrated circuits each handling different functions, including logic circuits for information processing, memory for storing information, and I/O circuits for information exchange with the outside world. The individually packaged integrated circuits have been mounted separately on a substrate such as a printed circuit board to form the integrated circuit system. In older SD Cards including individually packaged components on a printed circuit board, the printed circuit board took up all or almost all of the available space within the card. The printed circuit board was formed to that size in order to contain all of the individually. packaged components. More recently, system-in-a-package ("SiP") and multichip modules ("MCM") have been developed where a plurality of integrated circuit components have been packaged together to provide a complete electronic system in a single package. Typically, an MCM includes a plurality of chips mounted side by side on a substrate and then packaged. An SiP typically includes a plurality of chips, some or all of which may be stacked on a substrate and then packaged.

Integrated circuits are typically batch processed on a panel and then singulated into individual packages upon completion of the fabrication process. Several methods are known for singulating the semiconductor packages having irregular or curvilinear shaped edges from a panel of encapsulated integrated circuits. Known cutting methods include, for example, water jet cutting, laser cutting, water guided laser cutting, dry media cutting and diamond coated wire cutting. Such cutting methods are able to achieve sophisticated rectilinear and/or curvilinear shapes of the individualized integrated circuit packages. While these methods are effective at achieving curvilinear and irregular shapes in individualized semiconductor packages, these methods require precision cutting, and add complexity and cost to the semiconductor fabrication process.

SUMMARY OF THE INVENTION

Embodiments of the present invention relate to a method of manufacturing flash memory cards including a semiconductor package. In embodiments, the package may in general be formed by punching and cutting processes to define semiconductor packages of a wide variety of desired shapes. The process of fabricating the semiconductor package may begin with a substrate panel, which may for example be a leadframe. A plurality of integrated circuits are formed on the panel by first forming electrical traces on the leadframe through chemical etching or stamping processes. Thereafter, passive components and semiconductor die may be mounted on the panel to form a plurality of integrated circuits.

Once the plurality of integrated circuits have been formed on the panel, each of the integrated circuits may be encapsulated with a molding compound. During the encapsulation process, portions of the panel may be masked and left free of molding compound. Portions left free of molding compound may subsequently be punched from the panel. These punched areas may define chamfers, notches or a variety of other curvilinear, rectilinear and/or irregular shapes in the outer edges of the finished semiconductor package.

After the panel is punched, each of the integrated circuits may be singulated by sawing along straight cut lines into a plurality of generally rectangular semiconductor packages. The semiconductor packages include at least one outer edge, such as a chamfer and/or notch, which varies from the generally rectangular shape of the singulated package. By punching areas from the panel, and then sawing along straight edges, the present invention provides a simple, effective and cost efficient method for obtaining finished semiconductor packages of any of a variety of desired shapes.

BRIEF DESCRIPTION OF THE DRAWINGS

FIG. 2 is a top view of a portion of a panel of integrated circuits during the fabrication process according to the present invention.

FIG. 3 is a cross-sectional view through line 3-3 in FIG. 2.

FIG. 7 is a top view of an integrated circuit package according to embodiments of the present invention.

FIG. 8 is an edge view of a first edge of the integrated circuit package according to embodiments of the present invention.

FIG. 9 is an edge view of a second edge of the integrated circuit package according to embodiments of the present invention.

FIG. 10 is an edge view of a third edge of the integrated circuit package according to embodiments of the present invention.

FIG. 11 is an edge view of a fourth edge of the integrated circuit package according to embodiments of the present invention.

FIG. 12 is a bottom view of an integrated circuit package according to embodiments of the present invention.

DETAILED DESCRIPTION

Figure 1:
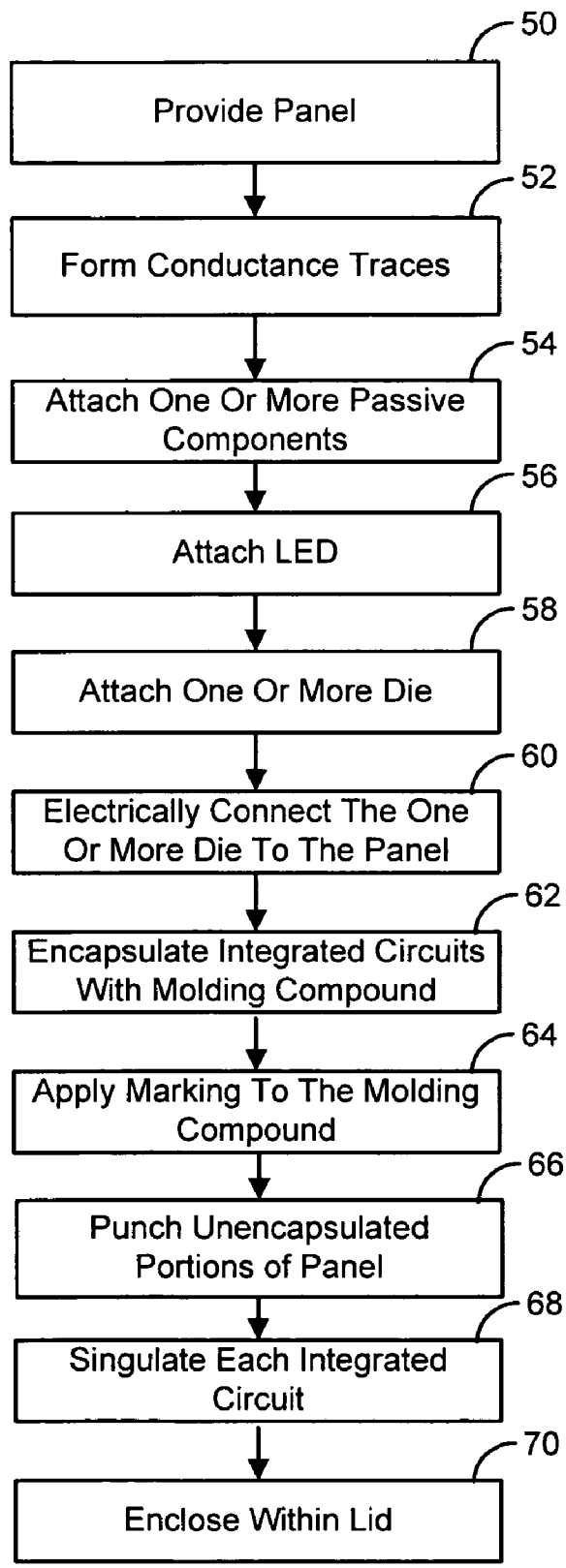
FIG. 1 is a flowchart of the method of fabricating a flash memory card according to embodiments of the present invention.

Embodiments of the invention will now be described with reference to FIGS. 1 through 15 which relate to a method of manufacturing flash memory cards. It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

A method for forming a flash memory card according to embodiments of the present invention will now be described with reference to the flowchart of FIG. 1. The fabrication process begins in step 50 with a panel 100, shown partially for example in FIGS. 2 and 3. The type of panel 100 used in the present invention may for example be a leadframe, printed circuit board ("PCB"), a tape used in tape automated bonding ("TAB") processes, or other known bases on which integrated circuits may be assembled and encapsulated.

In embodiments where panel 100 is leadframe based, leadframe 100 may be formed of a planar or substantially planar piece of metal, such as copper or copper alloys, plated copper or plated copper alloys, Alloy 42 (42Fe/58Ni), or copper plated steel. Leadframe 100 may be formed of other metals and materials known for use in leadframes. In embodiments where leadframe 100 is plated, leadframe 100 may be plated with silver, gold, nickel palladium, copper or other materials.

Where the integrated circuit is formed on a leadframe substrate, the conductance traces and layout of each leadframe may be formed in step 52 by known fabrication processes, such as for example, chemical etching. In chemical etching, a photoresist film may be applied to the leadframe. A pattern photomask containing the outline of the die paddle 102, electrical leads 104, contact pads 106 and slots 110 may then be placed over the photoresist film. The photoresist film may then be exposed and developed to remove the photoresist from areas on the conductive layers that are to be etched. The exposed areas are next etched away using an etchant such as ferric chloride or the like to define the pattern in the leadframe 100. The photoresist may then be removed. Other chemical etching processes are known. The conductance traces may form contact pads, lead fingers or other external connectors for electrical connection between the integrated circuit components and external electronic devices.

The leadframe 100 may alternatively be formed in a mechanical stamping process using progressive dies. As is known, mechanical stamping uses sets of dies to mechanically remove metal from a metal strip in successive steps.

In an embodiment where panel 100 is a PCB, the PCB may be formed of a dielectric core having one or more conductive layers formed on the top and/or bottom surface of the core. In such an embodiment, a conductance pattern may be formed on the conductive layers of panel 100 in a step 52 as described above to establish an electrical connection between the components mounted on panel 100.

Figure 4:
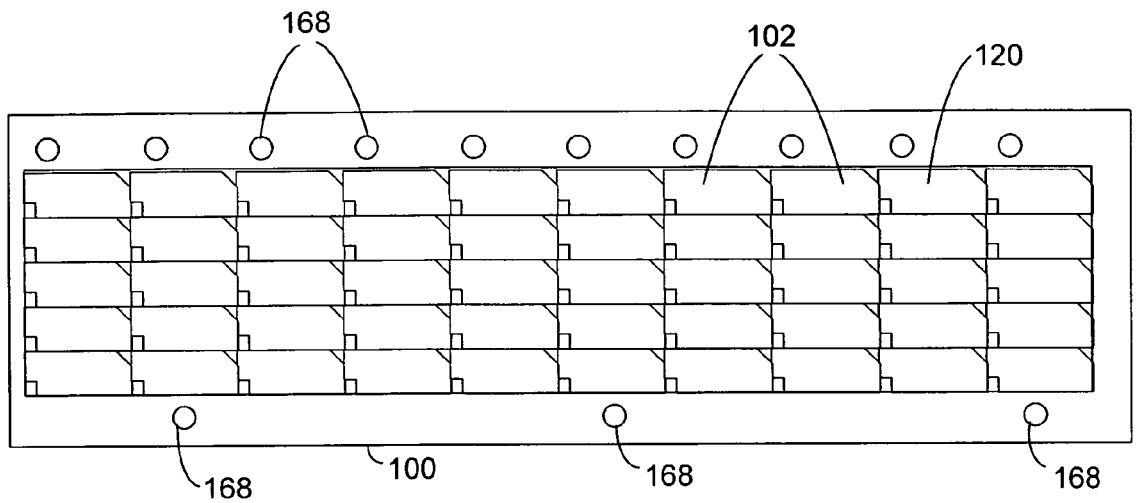
FIG. 4 is a top view of a panel of molded integrated circuits according to embodiments of the present invention prior to being cut into individual integrated circuit packages.

A plurality of discrete integrated circuits 102 may be formed on panel 100 in a batch process to achieve economies of scale. In an embodiment, the panel may be formed into a 5×10 array of 50 integrated circuits as shown in FIG. 4, but it is understood that the number of integrated circuits formed on panel 100 may be greater or lesser than 50 in alternative embodiments. After formation on panel 100, each of the integrated circuits 102 may then be encapsulated and singulated to form a plurality of integrated circuit packages as explained hereinafter.

Each integrated circuit 102 formed on panel 100 may include one or more passive components 104 surface mounted to panel 100 in step 54. The type and number of passive components 104 are not critical to the present invention and may vary widely in alternative embodiments. In an embodiment, the passive components 104 may include capacitors and/or resistors physically and electrically coupled to panel 100 as is known in the art.

Embodiments of the present invention may further include a light emitting diode ("LED") 108 surface mounted to panel 100 in a step 56. The LED 108 may be embedded within the finished package and have an active end emitting light out of an edge of the finished package. A package including such an LED 108 is described in U.S. Utility patent application Ser. No. 11/129,637, entitled "Method Of Assembling Semiconductor Devices With LEDs," by Takiar et al., filed May 13, 2005, which application has been incorporated by reference herein in its entirety. LED 108 may be omitted in embodiments of the invention.

Each integrated circuit 102 may further include one or more semiconductor die 114 mounted to panel 100 in step 58 in a known adhesive or eutectic die bond process, using a known die-attach compound. The number and type of semiconductor die 114 may vary greatly in alternative embodiments of the invention. In one embodiment, the one or more die 114 may include a flash memory array (e.g., NOR, NAND or other), S-RAM or DDT, and/or a controller chip such as an ASIC. Other semiconductor die are contemplated. The one or more die 114 may be electrically connected to panel 100 by wire bonds 116 in step 60 in a known wire-bond process. The die may be stacked in an SiP arrangement, mounted side-by-side in an MCM arrangement, or affixed in another packaging configuration.

While the mounting of the passive components 104, the LED 108 and the semiconductor die 114 are disclosed as separate steps in the flowchart of FIG. 1, it is understood that these steps may be performed in different orders, and one or more of these steps may be combined in alternative embodiments. Although not specifically shown on the flowchart of FIG. 1, various visual and automated inspections may be made during the above-described fabrication of the plurality of integrated circuits 102 on panel 100.

Once the plurality of integrated circuits 102 have been formed on panel 100, each of the integrated circuits 102 may be encapsulated with a molding compound 120 in step 62 and as shown in FIG. 4. Molding compound 120 may be an epoxy such as for example available from Sumitomo Corp. and Nitto Denko Corp., both having headquarters in Japan. Other molding compounds from other manufacturers are contemplated. The molding compound may be applied according to various processes, including by transfer molding or injection molding techniques, to encapsulate each of the integrated circuits 102.

Figure 6:
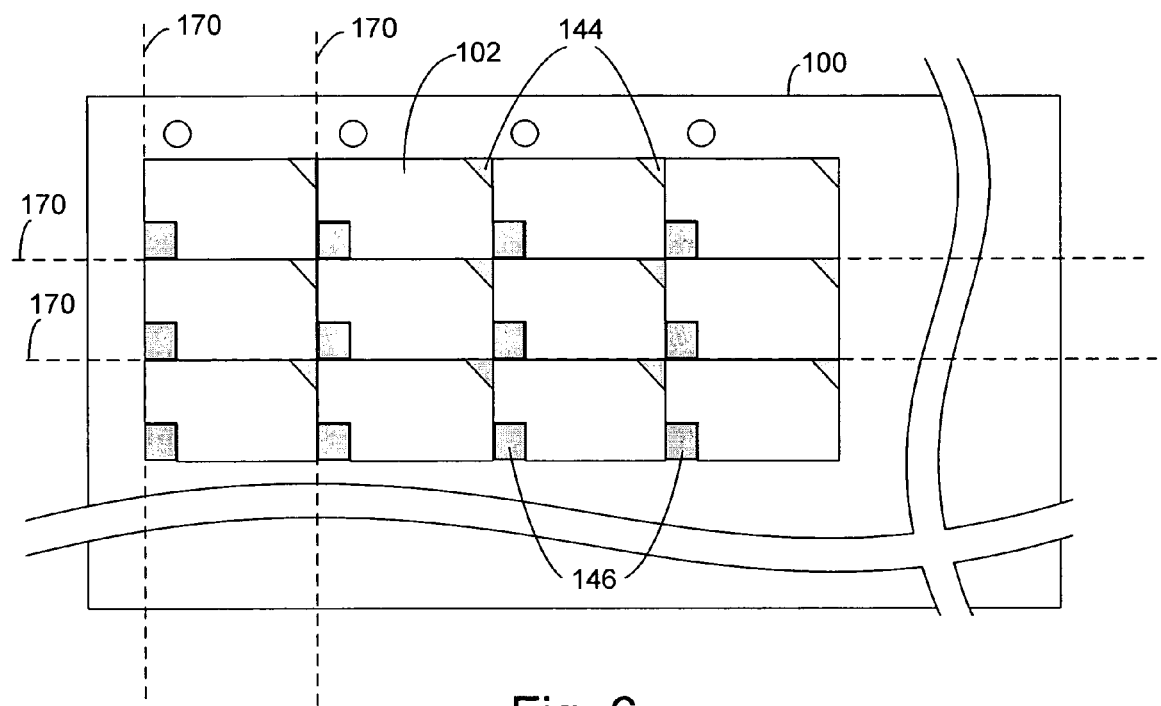
FIG. 6 is a top view of a portion of a panel of encapsulated integrated circuits during the fabrication process according to the present invention.

Some integrated circuit packages, such as those used in SD cards, have irregular shapes. For example, as shown in FIG. 6, each of the integrated circuit packages encapsulated on panel 100 includes a chamfer 144 and a generally rectangular shaped notch 146 in the finished package. In accordance with aspects of the present invention, irregular shaped portions which do not form part of the finished semiconductor package, such as chamfer 144 and notch 146, may be left free of molding compound during the encapsulation process of step 62. Various methods may be used to leave selected areas of panel 100 free of molding compound.

Figure 5:
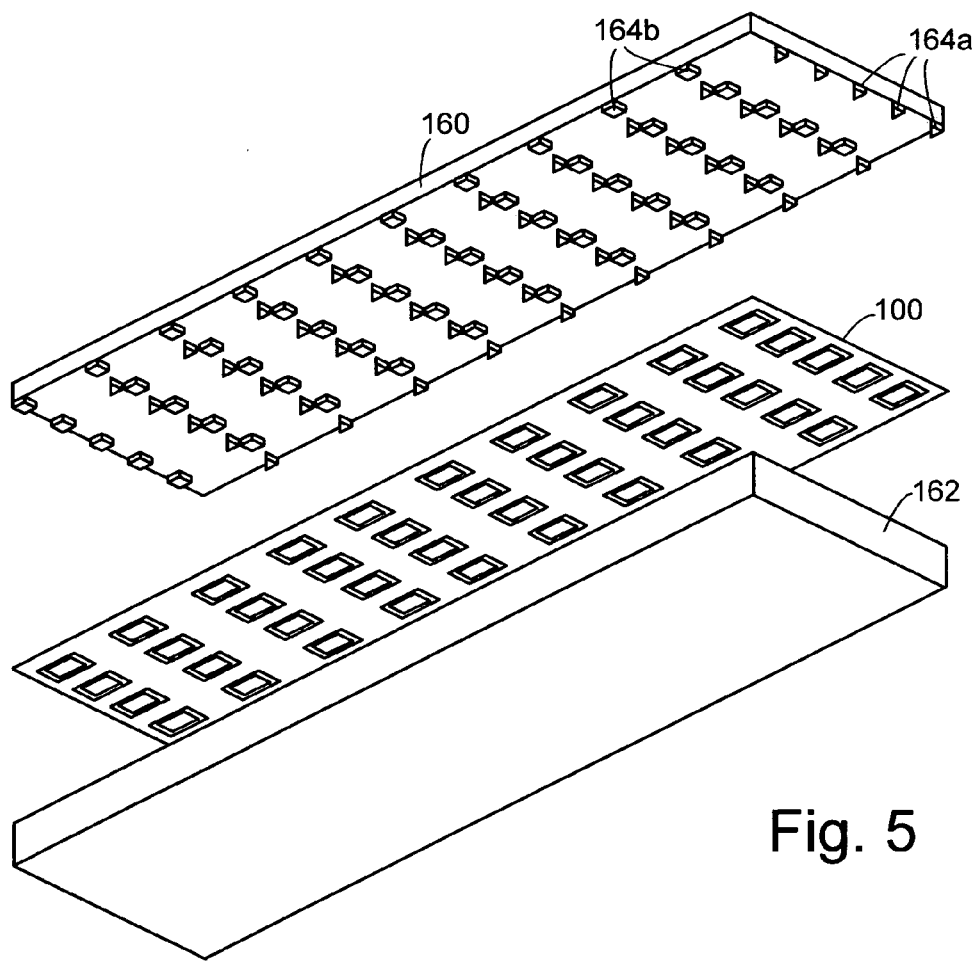
FIG. 5 is a bottom perspective view of molding process die plates used during the molding process to encapsulate the integrated circuits on the panel.

For example, FIG. 5 illustrates upper and lower mold cap die plates 160 and 162. As shown, upper mold cap die plate 160 includes protrusions 164a and 164b which match in shape and position to the shape and position of chamfers 144 and notches 146, respectively. During the molding process, a panel 100 (seen from the bottom in FIG. 5) may be put between mold cap die plates 160, 162. When the die plates are brought together and the mold compound introduced between the plates, the protrusions 164a and 164b contact the upper side of the panel 100 and prevent deposition of molding compound in the areas corresponding to chamfers 144 and notches 146. Thus, the finished encapsulated panel 100 is devoid of molding compound in the areas corresponding to the chamfers and notches. It is understood that any pattern of protrusions may be formed on upper mold cap die plate 160 to form any corresponding pattern of molding compound on panel 100. The areas left devoid of molding compound may have rectilinear edges, curvilinear edges, irregular shaped edges, or a combination of one or more of rectilinear, curvilinear and/or irregular shaped edges. It is further understood that a desired pattern of molding compound may be formed on panel 100 by methods other than protrusions on upper mold cap die plate 160.

The molding process 62 described above and shown in part in FIG. 5 may be for molding a substrate, such as a printed circuit board, which may receive molding on one side of the board. It is understood that the substrate may receive molding compound on both sides of the substrate, such as for example where the substrate is a leadframe. In such an embodiment, the lower die plate 162 may also be formed with protrusions 164a and 16b which are the mirror image of those formed on the upper die plate 160. Thus, overlying areas are defined on both the top and bottom surface of the substrate which are devoid of molding compound and may be punched as described hereinafter.

After molding step 62, a marking can be applied to the molding compound 120 in step 64. The marking may for example be a logo or other information printed on the surface of the molding compound 120 for each integrated circuit 102. The marking may for example indicate manufacturer and/or type of device. Marking step 64 may be omitted in alternative embodiments of the present invention.

In accordance with further aspects of the invention, the areas left unencapsulated after the molding process of step 62 may be punched out in step 66, as indicated by the shaded areas in the partial view of panel 100 in FIG. 6. In particular, using known punch and die presses, the areas left exposed after the encapsulation process may be punched from the panel to define the chamfer 144, notch 146 and/or other omitted shape in the finished package. The chamfer, notch or other area may be punched one at a time, a row or column at a time, or a two-dimensional array at a time. The panel may be advanced through the punching tool as is known in the art. The location of the areas to be punched may be optically identified by fiducial notches or holes 168 (FIG. 5) formed around the periphery of panel 100.

In embodiments, the selective encapsulation of panel 100 allows the required punching to be performed only on those areas of the panel devoid of molding composition. That is, as a result of the selective encapsulation process, the panel may be punched to define the chamfers 144, notches 146 or other shapes in the finished packages without having to punch through molding compound on the panel. It is understood that some punches may be made through molding compound, and some areas to be removed may include molding compound, in alternative embodiments. In embodiments, the shape and location of the areas on panel 100 punched out correspond to and match the shape and location of the areas of the finished package left devoid of molding compound. It is understood that the shape of the areas punched out of panel 100 need not be the same shape of the areas left devoid of molding compound in embodiments.

While the punching process is described as taking place after the integrated circuits are formed and encapsulated on panel 100, it is understood that panel 100 may be punched before the integrated circuits are formed on panel 100 and encapsulated. In such an embodiment, before, during or after the step 52 of forming the conductance pattern on panel 100, the areas on panel 100 forming chamfer 144, notches 146 or other areas may be removed in a punching process. Alternatively, the areas on panel 100 forming chamfer 144, notches 146 or other areas to be removed may be removed by other processes such as chemical etching of those areas. It is understood that the step of forming openings in panel 100 for chamfer 144, notches 146 or other areas may be performed where panel 100 is a leadframe, PCB, tape or other substrate on which integrated circuits may be assembled and encapsulated.

Each of the integrated circuits 102 may next be singulated in step 68. Singulation step 68 involves cutting integrated circuits 102 on panel 100 into a plurality of individual integrated circuit packages, each having a generally rectangular shape (as used herein, rectangular includes adjacent sides of unequal length or equal length, i.e., a square). The semiconductor packages include at least one outer edge, such as chamfer 144 and/or notches 146, which varies from the generally rectangular shape of the singulated package. Each integrated circuit may be singulated by cuts made by sawing along straight cut lines 170 shown partially in FIG. 6. As used herein, the terms "cut" and "cutting" are used to refer to a variety of severing methods including sawing, lasing, water jet cutting, punching or other methods used to separate the integrated circuits 102 into individual integrated circuit packages. The cuts may have a kerf of approximately, 0.3 mm, but the kerf may be narrower or wider than that in alternative embodiments.

Sawing is generally less expensive, less time consuming and requires less equipment than other cutting methods, such as for example water jet cutting or laser cutting, that are often used to achieve irregular or curvilinear cutting shapes in semiconductor packages. However, typically, sawing may be made only along straight edges. By punching areas from the panel, and then sawing along straight edges, at least one of which straight edge cuts is contiguous with the punched areas, the present invention provides a simple, effective and cost efficient method for obtaining finished semiconductor packages of any of a variety of desired shapes.

While sawing presents advantages with respect to reduced cost and complexity, it is understood that the panel 100 may be singulated by a variety of cutting methods in alternative embodiments, such as for example, water jet cutting, laser cutting, water guided laser cutting, dry media cutting, and diamond coated wire. Water can also be used together with laser cutting to help complement or focus its effects. A further description of the cutting of integrated circuits from a panel and the shapes which may be achieved thereby is disclosed in published U.S. Application No. 2004/0259291, entitled, "Method For Efficiently Producing Removable Peripheral Cards," which application is assigned to the owner of the present invention and which application has been incorporated by reference herein in its entirety. It is understood that the singulated integrated circuits may be formed by other processes than that described above in alternative embodiments.

An example of an integrated circuit ("IC") package 126 which may be obtained by the above-described process is shown in FIGS. 7 through 11. FIG. 7 is a top view of an IC package 126 cut from panel 100 and including integrated circuit 102 encapsulated within molding compound 120 as described above. IC package 126 may include a top surface 132, a first edge 134, a second edge 136, a third edge 138 and a fourth edge 140 around a periphery of the package. FIGS. 8 through 11 are edge views of the first through fourth edges, respectively, of package 126. FIG. 12 is a view of a bottom surface 142 of IC package 126 showing contact fingers 143 for establishing an electrical connection in the finished flash memory card between the card and a host electronic device. Where IC package 126 is used in an SD Card, IC package 126 may be built as a land grid array (LGA) package. Other types of packages, such as pin grid array (PGA) and ball grid array (BGA) packages are contemplated.

As explained above, chamfer 144 is formed in a corner between first edge 134 and fourth edge 140 for conforming to a chamfer in a flash memory card lid as explained in greater detail below. Notch 146 may be formed in a corner between second edge 136 and third edge 138 for location of a switch in a flash memory card lid as explained in greater detail below. In comparison to more complicated fabrication processes found in the prior art, the shape of IC package 126 including chamfer 144 and notch 146 may be obtained using only simple punching and straight edge cutting processes.

Figure 13:
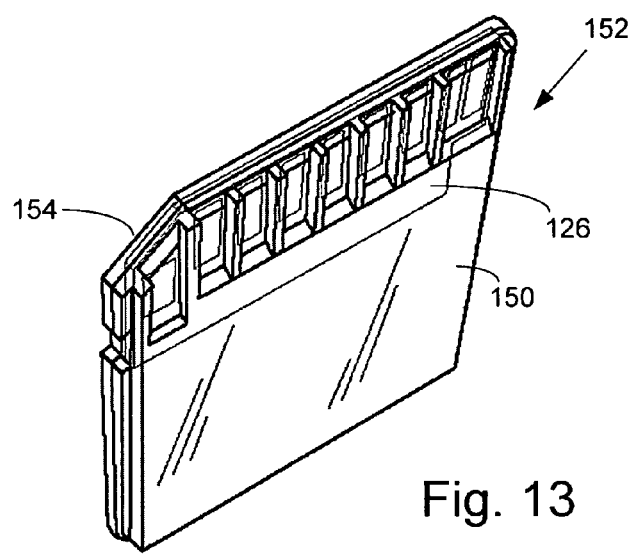
FIG. 13 is a perspective view of a flash memory card including the integrated circuit package of FIG. 7 mounted in a top and bottom lid.
Figure 14:
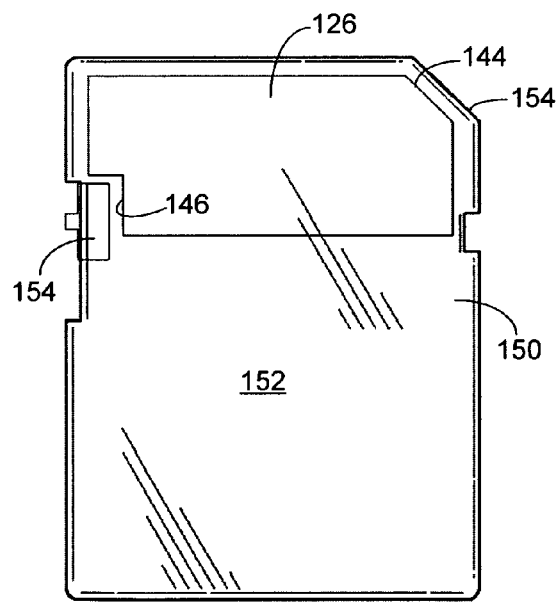
FIG. 14 is a top view of a flash memory card including the integrated circuit package of FIG. 7 mounted in a top and bottom lid.
Figure 15:
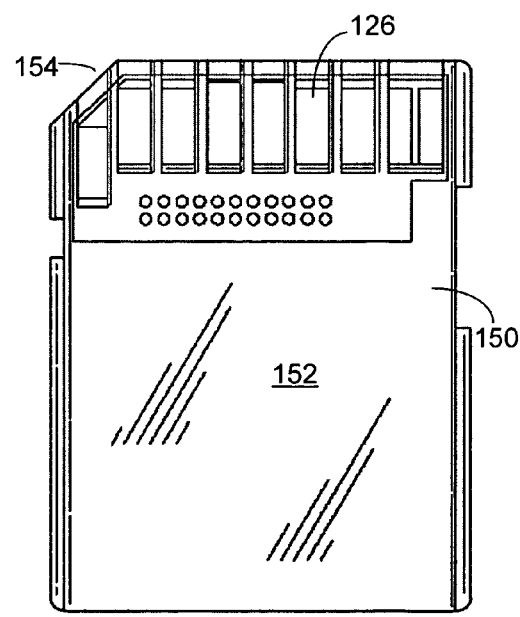
FIG. 15 is a bottom view of a flash memory card including the integrated circuit package of FIG. 7 mounted in a top and bottom lid.

Referring again to the flowchart of FIG. 1 and the views of FIGS. 13-15, a completed IC package 126 may further be enclosed within an external package or lid (or pair of lids) 150 in step 70. Such a lid 150 would provide an external covering for the IC package 126 and establish external product features. For example, as indicated above, IC package 126 may be shaped for use within an SD Card 152 having a standard SD Card lid configuration and footprint. In such an embodiment, the lid 150 includes a chamfer 154 between a first pair of edges to prevent the card from being improperly inserted into a standard SD card slot on a host device. In particular, each card slot would include an angled corner which mates with chamfer 154 when card 152 is properly inserted, but would prevent the card 152 from being fully inserted if some other corner of the card 152 was inserted against the angled corner within the host slot.

As indicated above, IC package 126 includes the chamfer 144. The IC package 126 is cut so that chamfer 144 matches up with and conforms to the size and shape of chamfer 154. Similarly, standard SD cards are formed with a switch 156 which cooperates with mechanisms in the host device to enable and disable read/write operations from/to the card. The IC package 126 is cut so that the notch 146 in package 126 is sized and positioned to not interfere with the switch 156 as it moves between its enable and disable positions.

In embodiments, the IC package 126 occupies only a fraction of the available space within card 152. For example, IC package 126 may have a maximum length (between the second edge 136 and fourth edge 140) of approximately 2 cm, and a maximum width (between the first edge 134 and third edge 138) of approximately 1 cm. With these dimensions, the IC package takes up less than one-half of the available space in card 152. It is understood that the IC package 126 may occupy more than one-half of the available space within card 152 in alternative embodiments.

Embodiments of the present invention have been described including an IC package which fits within the footprint of a standard SD card. However, it is understood that embodiments of the present invention may alternatively form an SiP, MCM, or other electronic system within a single package to fit within an outer lid or enclosure in a number of other flash memory standards. Such standards include but are not limited to a Compact Flash, a Smart Media, a Mini SD Card, an MMC, an xD Card, a Transflash memory card or a Memory Stick. Other devices are contemplated.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A method of fabricating a semiconductor package having a generally rectangular shaped outer periphery, the semiconductor package having at least one outer edge varying from the generally rectangular shape, the semiconductor package formed from a panel by the steps of:
   (a) encapsulating the panel in molding compound while leaving at least one of a notch and a chamfer formed in an outer edge of the semiconductor package free of molding compound;
   (b) punching the at least one of the notch and chamfer from the panel to define the at least one outer edge in the semiconductor package; and
   (c) singulating the semiconductor package from the panel by straight edge cuts through the panel, at least one straight edge cut being contiguous with the at least one of the notch and chamfer punched in said step (b).

2. A method of fabricating a semiconductor package as recited in claim 1, said step of singulating the semiconductor package comprising the step of sawing through the panel.

3. A method of fabricating a semiconductor package as recited in claim 1, said step (b) of punching at least one of the notch and chamfer from the panel forms the at least one outer edge into at least one of a curvilinear, rectilinear and irregular shaped edge in the semiconductor package.

4. A method of fabricating a semiconductor package as recited in claim 1, said step (b) of punching at least one of the notch and chamfer from the panel comprises the step of punching through at least one unencapsulated area of a leadframe.

5. A method of fabricating a semiconductor package as recited in claim 1, said step (b) of punching at least one of the notch and chamfer from the panel comprises the step of punching through at least one unencapsulated area of a printed circuit board.

6. A method of fabricating a semiconductor package as recited in claim 1, said step (a) of encapsulating the panel in molding compound while leaving at least one of a notch and a chamfer adjacent the at least one outer edge free of molding compound comprises placing the panel between a pair of mold cap die plates, one of the mold cap die plates including at least one protrusion for contacting the panel to define at least one of a notch and a chamfer free of molding compound.

7. A method of fabricating a semiconductor package from a panel of integrated circuits, comprising the steps of:
   (a) encapsulating the panel, leaving a plurality of portions of the panel devoid of molding compound;
   (b) punching the plurality of portions devoid of molding compound from the panel to form voids in the panel; and
   (c) sawing through the encapsulated portions of the panel to singulate the plurality of semiconductor packages from the panel, the plurality of voids forming sections of the outer periphery of the plurality of semiconductor packages after said step (c) of sawing the plurality of semiconductor packages from the panel.

8. A method of fabricating a semiconductor package as recited in claim 7, the plurality of voids forming chamfers in the outer periphery of the plurality of semiconductor packages after said step (c) of sawing the plurality of semiconductor packages from the panel.

9. A method of fabricating a semiconductor package as recited in claim 7, the plurality of voids forming notches in the outer periphery of the plurality of semiconductor packages after said step (c) of sawing the plurality of semiconductor packages from the panel.

10. A method of fabricating a semiconductor package as recited in claim 7, the plurality of voids forming at least one of curvilinear, rectilinear and irregular shaped edges in the outer periphery of the plurality of semiconductor packages after said step (c) of sawing the plurality of semiconductor packages from the panel.

11. A method of fabricating a semiconductor package as recited in claim 7, said step (b) of punching the at least one area from the panel forms the at least one outer edge into at least one of a curvilinear, rectilinear and irregular shaped edge in the semiconductor package.

12. A method of fabricating a semiconductor package from a panel of integrated circuits, comprising the steps of:
   (a) forming a void in a first portion of the panel, said void defining a first section of an outer edge of the semiconductor package; and
   (b) cutting a second portion of the panel along a straight line to define a second section of the outer edge of the semiconductor package contiguous with the first section.

13. A method of fabricating a semiconductor package from an integrated circuit as recited in claim 12, further comprising the step of encapsulating the panel with molding compound, said step of encapsulation leaving said first portion of the panel free of molding compound.

14. A method of fabricating a semiconductor package from an integrated circuit as recited in claim 12, said step (a) of forming a void in a first portion of the panel defines a chamfer in the outer edge of the semiconductor package.

15. A method of fabricating a semiconductor package from an integrated circuit as recited in claim 12, said step (a) of forming a void in a first portion of the panel defines a notch in the outer edge of the semiconductor package.

16. A method of fabricating a semiconductor package from an integrated circuit as recited in claim 12, wherein said first section of the outer edge of the semiconductor package has at least one of a curvilinear and an irregular shape.

17. A method of fabricating a semiconductor package from an integrated circuit as recited in claim 12, said step (a) of forming a void in a first section of the panel comprising the step of punching through the panel.

18. A method of fabricating a semiconductor package from an integrated circuit as recited in claim 12, said step (a) of forming a void in a first section of the panel comprising the step of etching through the panel.

19. A flash memory card including a semiconductor package formed from a panel of integrated circuits, the flash memory card formed by a process comprising the steps of:
   (a) encapsulating the panel with molding compound, leaving a portion of the panel devoid of molding compound;
   (b) punching the portion of the panel devoid of molding compound from the panel to form a void in the panel;
   (c) sawing through the molding compound to singulate the semiconductor package from the panel, the void forming a section of the outer periphery of the semiconductor package after said step (c) of sawing the semiconductor package from the panel; and
   (d) encasing the semiconductor package within one or more lids.

20. A flash memory card as recited in claim 19, the semiconductor package comprising a leadframe.

21. A flash memory card as recited in claim 19, the semiconductor package comprising a printed circuit board.

22. A flash memory card as recited in claim 19, the flash memory card comprising a secure digital (SD) card.

23. A flash memory card as recited in claim 19, the flash memory card comprising one of a Compact Flash, a Smart Media, a Mini SD Card, an MMC, an xD Card, a Transflash memory card and a Memory Stick.

* * * * *